US008028406B2

(12) United States Patent
Ding et al.

(10) Patent No.: US 8,028,406 B2
(45) Date of Patent: Oct. 4, 2011

(54) METHODS OF FABRICATING COPLANAR WAVEGUIDE STRUCTURES

(75) Inventors: Hanyi Ding, Essex Junction, VT (US); Essam F. Mina, South Burlington, VT (US); Guoan Wang, South Burlington, VT (US); Wayne H. Woods, Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 853 days.

(21) Appl. No.: 12/061,861

(22) Filed: Apr. 3, 2008

(65) Prior Publication Data

US 2009/0249610 A1 Oct. 8, 2009

(51) Int. Cl.
*H05K 3/10* (2006.01)
*H01P 11/00* (2006.01)
*H01P 3/00* (2006.01)

(52) U.S. Cl. ............................... 29/846; 29/850; 29/600

(58) Field of Classification Search .......... 333/156–161, 333/236–244; 29/600–601, 846–853; 174/251, 174/261, 262; 361/816–818; 438/23–28, 438/34–35, 57–98; 257/414, 421–427, 428–466, 257/659–660
See application file for complete search history.

(56) References Cited

U.S. PATENT DOCUMENTS 4,914,407 A * 4/1990 Itoh .............................. 333/161
5,334,800 A * 8/1994 Kenney ......................... 174/250
5,446,243 A * 8/1995 Crowder et al. .............. 174/250
5,538,433 A * 7/1996 Arisaka ........................... 439/70
5,717,231 A * 2/1998 Tserng et al. ................. 257/276
6,040,524 A * 3/2000 Kobayashi et al. ............. 174/36
6,101,705 A * 8/2000 Wolfson et al. ................. 29/600
6,133,805 A * 10/2000 Jain et al. .......................... 333/1
6,353,189 B1 * 3/2002 Shimada et al. .............. 174/255
6,372,996 B2 * 4/2002 Lin et al. ....................... 174/250
6,426,686 B1 * 7/2002 Douriet et al. ................ 333/247
6,430,805 B1 * 8/2002 Ekmekji et al. ................. 29/600
6,664,638 B2 * 12/2003 Ushiyama et al. ............ 257/773
6,812,411 B2 * 11/2004 Belau et al. ................... 174/261
7,005,371 B2 * 2/2006 Chinthakindi et al. ....... 438/618
(Continued)

OTHER PUBLICATIONS

Cheung, et al., "Shielded Passive Devices for Silicon-Based Monolithic Microwave and Millimeter-Wave Integrated Circuits", IEEE Journal of Solid-State Circuits, vol. 41, No. 5, May 2006, pp. 1183-1200.

(Continued)

*Primary Examiner* — Derris H Banks
*Assistant Examiner* — Kaying Kue
(74) *Attorney, Agent, or Firm* — Wood, Herron & Evans, LLP

(57) ABSTRACT

Methods for fabricating a coplanar waveguide structure. The method may include forming first and second ground conductors and a signal conductor in a coplanar arrangement between the first and second ground conductors, forming a first coplanar array of substantially parallel shield conductors above the signal conductor and the first and second ground conductors, and forming a second coplanar array of substantially parallel shield conductors below the signal conductor and the first and second ground conductors. The method further includes forming a first plurality of conductive bridges located laterally between the signal conductor and the first ground conductor, and forming a second plurality of conductive bridges located laterally between the signal conductor and the second ground conductor. Each of the first plurality of conductive bridges connects one of the shield conductors in the first array with one of the shield conductors in the second array. Each of the second plurality of conductive bridges connects one of the shield conductors in the first array with one of the shield conductors in the second array.

11 Claims, 4 Drawing Sheets

U.S. PATENT DOCUMENTS

| | | | | |
|---|---|---|---|---|
| 7,064,438 | B2 * | 6/2006 | Ahn et al. | 257/751 |
| 7,084,058 | B2 * | 8/2006 | Ahn et al. | 438/652 |
| 7,170,361 | B1 * | 1/2007 | Farnworth | 333/1 |
| 7,332,983 | B2 * | 2/2008 | Larson | 333/161 |
| 7,626,476 | B2 * | 12/2009 | Kim et al. | 333/238 |
| 7,645,941 | B2 * | 1/2010 | Wesselman et al. | 174/251 |
| 7,739,624 | B2 * | 6/2010 | McElvain et al. | 716/101 |
| 7,812,694 | B2 * | 10/2010 | Ding et al. | 333/238 |
| 2002/0149108 | A1 * | 10/2002 | Ahn et al. | 257/751 |
| 2002/0155643 | A1 * | 10/2002 | Iwanaga et al. | 438/133 |
| 2003/0127710 | A1 * | 7/2003 | Ahn et al. | 257/664 |
| 2004/0090282 | A1 * | 5/2004 | Minami | 333/1 |
| 2004/0124956 | A1 * | 7/2004 | Ahn et al. | 333/238 |
| 2004/0155728 | A1 * | 8/2004 | Cheung et al. | 333/161 |
| 2004/0171249 | A1 * | 9/2004 | Ahn et al. | 438/637 |
| 2006/0272851 | A1 * | 12/2006 | Haridass et al. | 174/255 |
| 2010/0265011 | A1 * | 10/2010 | Ding et al. | 333/204 |

OTHER PUBLICATIONS

Ma, et al., "Experimentally Investigating Slow-Wave Transmission Lines and Filters Based on Conductor-Backed CPW Periodic Cells", IEEE Jun. 2005, pp. 1653-1656.

Seki, et al., "Cross-Tie Slow-Wave Coplanar Waveguide on Semi-Insulating GaAs Substrates", Electronics Letters, Dec. 10, 1981, vol. 17, No. 25, pp. 940-941.

Sun, et al., "A Compact Branch-Line Coupler Using Discontinuous Microstrip Lines", IEEE Microwave and Wireless Components Letters, vol. 15, No. 8, Aug. 2005, pp. 519-520.

Sor, et al., "A Novel Low-Loss Slow-Wave CPW Periodic Structure for Filter Applications", 2001 IEEE Microwave Symposium Digest, vol. 1, (4 pages).

Wu, et al., "Hybrid-Mode Analysis of Homogeneously and Inhomogeneously Doped Low-Loss Slow-Wave Coplanar Transmission Lines", IEEE Transactions on Microwave Theory and Techniques, vol. 39, No. 8, Aug. 1991, pp. 1348-1360.

USPTO, Notice of Allowance issued in related U.S. Appl. No. 12/061,950 dated Sep. 7, 2010.

USPTO, Office Action issued in related U.S. Appl. No. 12/061,950 dated Mar. 9, 2010.

USPTO, Office Action issued in related U.S. Appl. No. 12/061,950 dated Oct. 22, 2009.

* cited by examiner

METHODS OF FABRICATING COPLANAR WAVEGUIDE STRUCTURES

CROSS-REFERENCE TO RELATED APPLICATIONS

This application is related to application Ser. No. 12/061,950, filed on Apr. 3, 2008 and entitled "Coplanar Waveguide Structures and Design Structures for Radiofrequency and Microwave Integrated Circuits," the disclosure of which is incorporated by reference herein in its entirety.

FIELD OF THE INVENTION

The invention relates generally to semiconductor device fabrication and, in particular, to methods of fabricating coplanar waveguide structures.

BACKGROUND OF THE INVENTION

Future hand-held and ground communications systems, as well as communications satellites, will require very low weight, and low power consumption in addition to higher data rates and increased functionality. Radiofrequency and microwave circuit boards used in such communications systems integrate discrete passive components, such as high-Q inductors, capacitors, varactors, and ceramic filters, for matching networks, LC tank circuits in voltage controlled oscillators, attenuators, power dividers, filtering, switching, decoupling, and reference resonators. Trends in the design of circuit boards for communications systems include reducing both board size and component count. Passive components consume a substantial fraction of the total board space, which presents challenges in furthering these trends.

To reduce the space taken up by the passive components, discrete passive components are being replaced with on-chip passive components. Size reduction of passive components may depend at least in part on the further development of on-chip interconnects, such as slow wave coplanar waveguide (CPW) structures, for microwave and millimeter microwave integrated circuits (MICs), microwave and millimeter monolithic microwave integrated circuits (MMICs), and radiofrequency integrated circuits (RFICs) used in communications systems. In particular, interconnects that promote slow-wave propagation can be employed to reduce the sizes and cost of distributed elements to implement delay lines, variable phase shifters, voltage-tunable filters, etc.

Advanced methods of coplanar waveguide structures are needed for radiofrequency and microwave integrated circuits to serve as interconnects that promote slow-wave propagation.

SUMMARY OF THE INVENTION

In accordance with an embodiment of the invention, a method is provided for fabricating a coplanar waveguide structure. The method includes forming first and second ground conductors and a signal conductor in a coplanar arrangement with the signal conductor laterally between the first and second ground conductors, forming a first coplanar array of substantially parallel shield conductors above the signal conductor and the first and second ground conductors, and forming a second coplanar array of substantially parallel shield conductors below the signal conductor and the first and second ground conductors. The method further includes forming a first plurality of conductive bridges located laterally between the signal conductor and the first ground conductor, and forming a second plurality of conductive bridges located laterally between the signal conductor and the second ground conductor. Each of the first plurality of conductive bridges connects one of the shield conductors in the first array with one of the shield conductors in the second array. Each of the second plurality of conductive bridges connects one of the shield conductors in the first array with one of the shield conductors in the second array.

In accordance with another embodiment of the invention, a method is provided for fabricating a coplanar waveguide structure. The method includes forming metal features in a first metal layer of a BEOL interconnect structure that define a signal conductor and first and second ground conductors flanking the signal conductor, forming metal features in a second metal layer of the BEOL interconnect structure above the first metal layer that define a first array of shield conductors, and forming metal features in a third metal layer of the BEOL interconnect structure below the first metal layer that define a second array of shield conductors. The method further includes connecting the metal features in the second and third arrays with conductive bridges to define a plurality of closed loops extending about the signal conductor.

BRIEF DESCRIPTION OF THE DRAWINGS

The accompanying drawings, which are incorporated in and constitute a part of this specification, illustrate embodiments of the invention and, together with a general description of the invention given above and the detailed description of the embodiments given below, serve to explain the principles of the invention.

DETAILED DESCRIPTION

Embodiments of the invention are directed to an optimized structure for a waveguide structure, which may have the representative form of a slow-wave, shielded coplanar waveguide transmission line, integrated in the back-end-of-line (BEOL) metallization layers of an integrated circuit. The coplanar waveguide structure features coplanar signal and ground conductors, a first coplanar array of shield conductors on a metal layer above the signal conductors, and a second array of shield conductors on a metal layer below the signal and ground conductors. The first and second arrays of shield conductors are aligned orthogonally to the direction of the signal conductor. In addition to being optimized for wave propagation properties along the shield conductors, the shield conductor arrays are simultaneously ensured to meet metal fill ground rules required for successful polishing in a copper metallurgy process.

Figure 1:
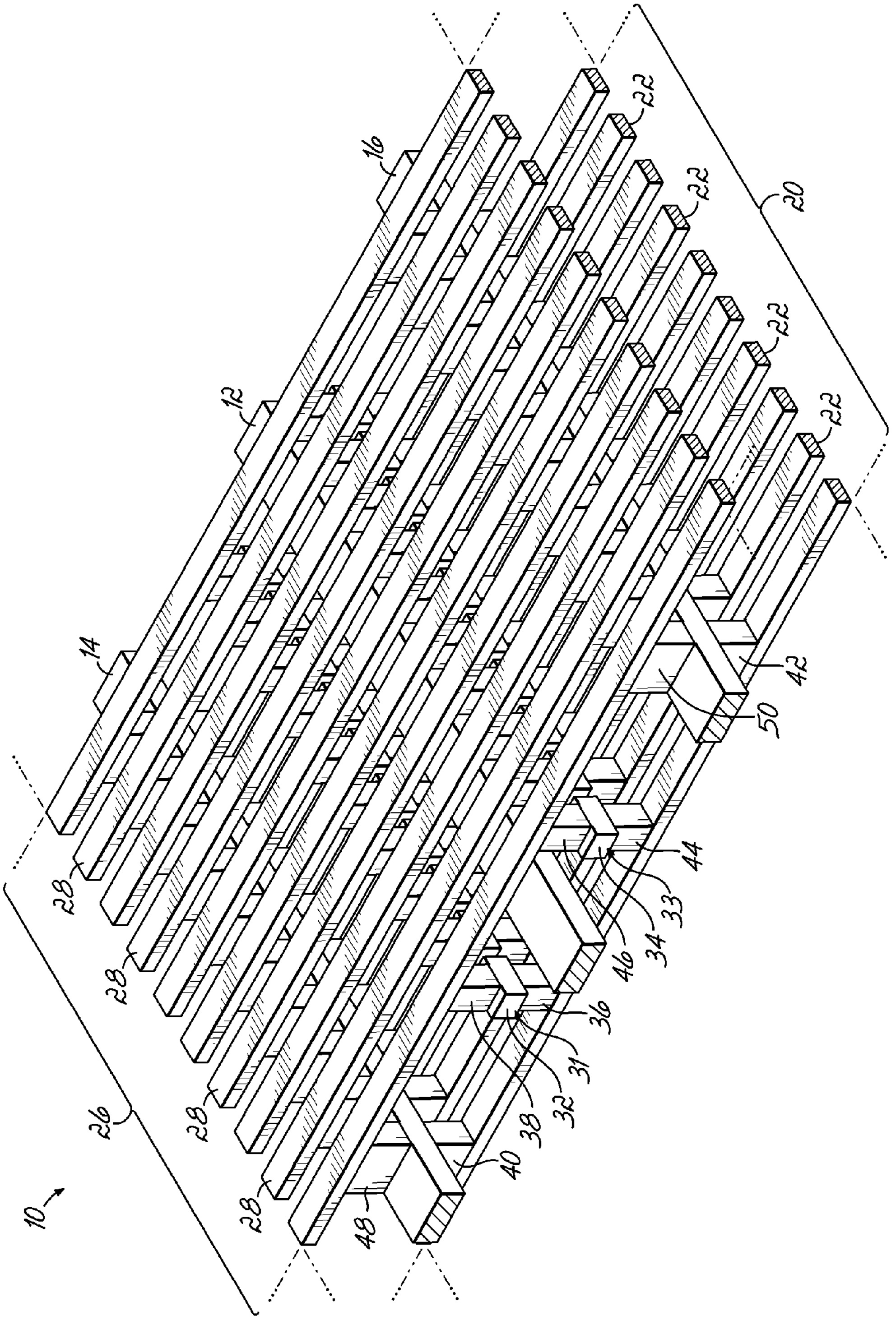
FIG. 1 is a diagrammatic top view of a portion of a coplanar waveguide structure in accordance with an embodiment of the invention and in which certain dielectric layers are omitted for clarity.
Figure 1A:
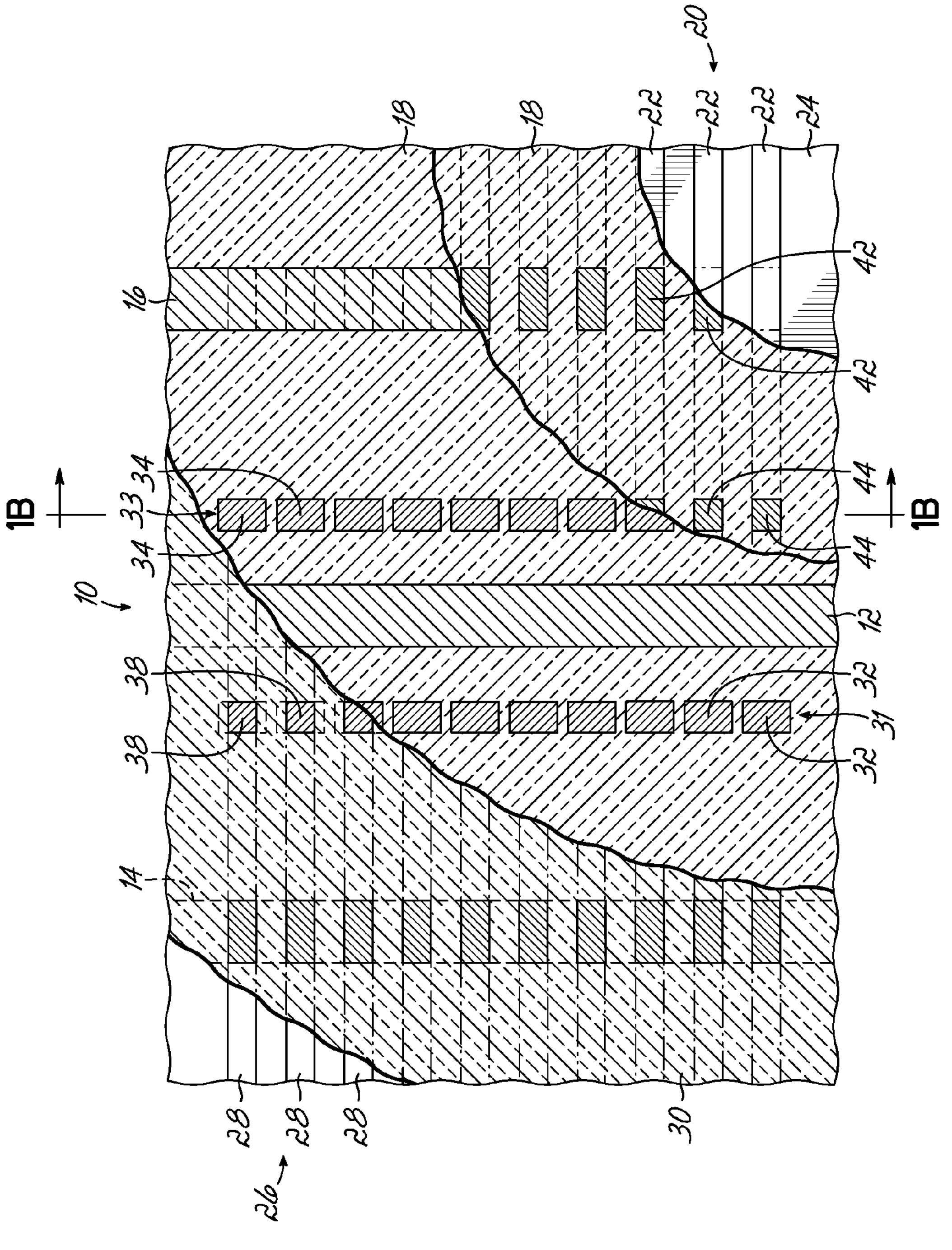
FIG. 1A is a top view of the coplanar waveguide structure in FIG. 1 in which certain dielectric layers are shown partially broken away for clarity.
Figure 1B:
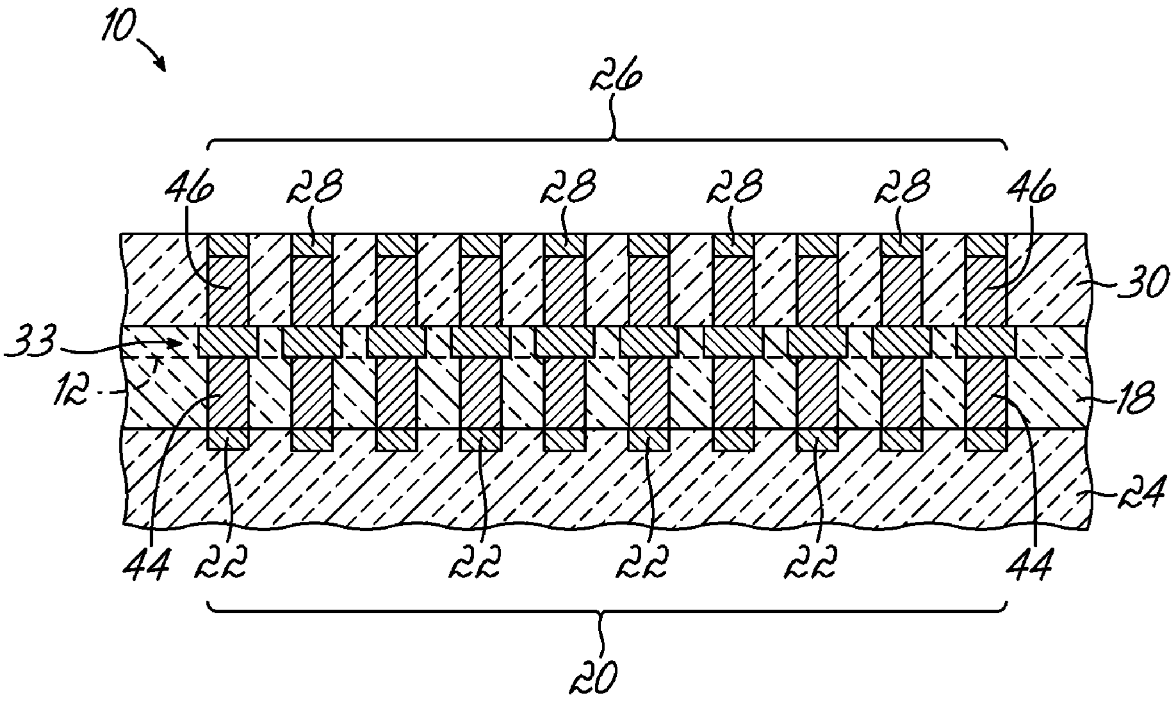
FIG. 1B is a cross section taken generally along lines 1B-1B of FIG. 1A.

With reference to FIGS. 1, 1A, and 1B, a coplanar waveguide structure 10 includes a signal conductor 12 and ground conductors 14, 16 each having the representative form of strips of a conductive material that are buried in, and surrounded by, an insulating layer 18 (FIGS. 1A, 1B) of a dielectric material. The coplanar waveguide structure 10 is carried on a substrate (not shown), which includes at least one integrated circuit formed thereon and/or therein with devices having features that are coupled with the signal conductor 12. The features may comprise metallization lines, a contact, a semiconductor material, and/or features of circuit elements previously formed on and/or in the substrate. The substrate is typically a chip carrying an entire integrated circuit and formerly a processed portion of a semiconductor wafer. An electrical signal is propagated through the signal conductor 12 between at least two of the features of the integrated circuit chip on the substrate and the ground conductors 14, 16, which are connected to electrical ground to define a ground plane, supply a return current path.

Ground conductor 16 flanks the signal conductor 12 on one side and ground conductor 14 flanks the signal conductor 12 on the opposite side. Ground conductors 14, 16 reside in a common metallization level, and plane, as signal conductor 12. The ground conductors 14, 16 are electrically isolated from each other and from signal conductor 12 by portions of the insulating layer 18. The proximity of the ground conductors 14, 16 to the signal conductor 12 reduces the inductance of the coplanar waveguide structure 10. Generally, the lengths of the signal conductor 12 and the ground conductors 14, 16 are approximately equal. The other dimensions of the signal conductor 12 and ground conductors 14, 16, such as line width, pitch, and thickness, are selected when the coplanar waveguide structure 10 is designed. The inductance per unit length of the coplanar waveguide structure 10 is tuned by adjusting the separation between the signal conductor 12 and the ground conductors 14, 16. However, the minimum impedance is limited by the slot width between each of the ground conductors 14, 16 and the signal conductor 12 allowed by design rules.

The coplanar waveguide structure 10 includes a first coplanar array, generally indicated by reference numeral 20, of shield conductors 22 in the representative shape of strips or lines is disposed in an insulating layer 24 (FIGS. 1A, 1B) located between the substrate and the insulating layer 18. The coplanar waveguide structure 10 further includes a second coplanar array, generally indicated by reference numeral 26, of shield conductors 28 in the representative form of strips or lines is disposed in an insulating layer 30 (FIGS. 1A, 1B) that overlies the insulating layer 18 so that insulating layers 18 and 24 are located between insulating layer 30 and the substrate. The shield conductors 22 are electrically linked together with each other, as are shield conductors 28, and each of the arrays 20, 26 is tied to electrical ground. The shield conductors 22, 28 are constructed and arranged to define gaps so that the respective arrays 20, 26 do not resemble a continuous ground plane or sheet.

The shield conductors 22 in array 20 have a mutually parallel arrangement and cross under the signal conductor 12 and ground conductors 14, 16. The shield conductors 28 in array 26 also have a mutually parallel arrangement and cross over the signal conductor 12 and ground conductors 14, 16. The shield conductors 22, 28 are aligned approximately orthogonally relative to the signal conductor 12 (and to the ground conductors 14, 16), which is therefore also approximately orthogonal to the signal propagation direction in the signal conductor 12 so there will be negligible or no induced current in the shield conductors 22, 28 along the signal propagation direction and, thereby, avoid electromagnetic interference. The arrays 20, 26 are mutually aligned and the shield conductors 22 have approximately the same width and spacing as the shield conductors 28 so that one of the shield conductors 22 directly overlies one of the shield conductors 28.

The coplanar waveguide structure 10 includes a discontinuous linear array or row 31 of discrete planar arms or segments 32 that is provided in the metallization layer containing the signal conductor 12 and ground conductors 14, 16. The segments 32, which are not interconnected with each other, are located between the signal conductor 12 and ground conductor 14 at a lateral location in the plane that is closer to the signal conductor 12 than to the ground conductor 14.

The coplanar waveguide structure 10 further includes another discontinuous linear array or row 33 of discrete planar arms or segments 34 is provided in the metallization layer containing the signal conductor 12 and ground conductors 14, 16. The segments 34, which are not interconnected with each other, are located between the signal conductor 12 and ground conductor 16 at a lateral location in the plane that is closer to the signal conductor 12 than to the ground conductor 16.

The planar segments 32, 34 are substantially coplanar with the signal conductor 12 and the ground conductors 14, 16. Adjacent pairs of segments 32 and adjacent pairs of segments 34 are separated by gaps and are electrically isolated by portions of the insulating layer 18 occupying the respective gaps. The planar segments 32, 34 are shaped as cuboids or rectangular prisms with three pairs of rectangular faces placed opposite each other and joined at right angles to each other. An end face of each segment 32 confronts an end face of the adjacent segment 32, and an end face of each segment 34 confronts an end face of the adjacent segment 34.

Conductor-filled vias 36, which extend laterally in a linear array or row, extend vertically upward between the shield conductors 22 and the segments 32. Conductor-filled vias 38, which also extend laterally in a linear array or row, extend vertically downward between the shield conductors 28 and the segments 32. A bottom face of each of the segments 32 is intersected from below by one of the vias 36 and a top face of each of the segments 32 is intersected from above by one of the vias 38 so as to collectively define a conductive bridge extending between one of the shield conductors 22 and one of the shield conductors 28. Additional lines or rows of conductor-filled vias 40, 42 extend vertically between the shield conductors 22 and a respective one of the ground conductors 14, 16.

Conductor-filled vias 44, which extend laterally in a linear array or row, extend vertically upward between the shield conductors 22 and the segments 34. Conductor-filled vias 46, which also extend laterally in a linear array or row, extend vertically downward between the shield conductors 28 and the segments 34. A bottom face of each segment 34 is intersected from below by one of the vias 44 and a top face of each segment 34 is intersected from above by one of the vias 46 so as to collectively define a conductive bridge extending between one of the shield conductors 22 and one of the shield conductors 28. Additional lines or rows of conductor-filled vias 48, 50 extend vertically between the shield conductors 28 and a respective one of the ground conductors 14, 16.

Vias 36 and 38 have approximately the same width and spacing as the segments 32 and the shield conductors 22, 28. Consequently, each of the segments 32 is aligned vertically with one of the conductor-filled vias 36 and one of the conductor-filled vias 38. Similarly, vias 44 and 46 have approximately the same width and spacing as the segments 34 and the shield conductors 22, 28. Hence, each of the segments 34 is aligned vertically with one of the conductor-filled vias 44 and one of the conductor-filled vias 46. The segments 32, 34 have a greater cross-sectional area than the vias 36, 38, 44, 46 when viewed from a vertical perspective.

A closed loop is formed by a pair of the vias 36, 38, a portion of the shield conductor 22 between each pair of vias

36, 38, one of the segments 32, a pair of vias 44, 46, a portion of the shield conductor 28 between each pair of vias 44, 46, and one of the segments 34. Hence, a plurality of closed loops encircles the signal conductor 12 at a series of spaced apart locations dispersed with a uniform spacing along the length of the signal conductor 12. The segments 32, 34 function to effectively increase the capacitance per unit length of the coplanar waveguide structure 10 and, thereby, supplement the capacitive coupling that exists between the signal conductor 12 and the shield conductors 22, 28.

In an alternative embodiment, the segments 32, 34 may be omitted. As a result, the vias 36 and 38 directly contact to cooperate in establishing one set of the conductive bridges extending between the shield conductors 22, 28 and the vias 44 and 46 directly contact to cooperate in establishing the other set of the conductive bridges extending between the shield conductors 22, 28.

In a typical complementary metal oxide semiconductor (CMOS) fabrication sequence, the semiconductor devices of the integrated circuit are fabricated on the substrate by conventional front end of line (FEOL) processing culminating with the M1-level of metallization. A stratified stack of interconnected metal lines and vias is then fabricated by standard back end of line (BEOL) processing, such as damascene and dual-damascene processes. The metal lines are arranged in different metallization levels (M2-level, M3-level, etc.) overlying the M1-level and each of the via levels interconnects the metal lines in two adjacent metallization levels. Generally, successive insulating layers are applied and individually processed by BEOL processing to define the different levels of metallization. Generally, vias and trenches are defined in each of the insulating layers using known lithography and etching techniques, and the trenches and vias are filled with a desired metal. Any excess overburden of metal remaining after the filling step is removed by planarization, such as by a chemical mechanical polishing (CMP) process. The BEOL metallization levels define an interconnect structure for the semiconductor devices of the integrated circuit.

Signal conductor 12, ground conductors 14, 16, shield conductors 22, 28, segments 32, 34, and conductor-filled vias 36, 38, 40, 42, and conductor-filled vias 44, 46, 48, 50 may be fabricated by the standard BEOL processing, such as damascene and dual-damascene processes, when the metallization levels and via levels are formed in the interconnect structure. For example, the signal conductor 12, ground conductors 14, 16, and segments 32, 34, may be disposed in an M5-level, the shield conductors 22 may be disposed in an M4-level closer to the substrate than the M5-level, the vias 36, 38, 40, 42 may connect the M4-level and the M5-level, the shield conductors 28 may be disposed in an M6-level further from the substrate than the M5-level, and the vias 44, 46, 48, 50 may connect the M5-level and the M6-level. Typically, metallization features formed by BEOL processing in upper metallization levels are thicker than metallization features formed in lower metallization levels, which implies that the shield conductors 28 may be thicker than the signal conductor 12, ground conductors 14, 16, and segments 32, 34, which in turn may be thicker than the shield conductors 22.

Insulating layers 18, 24, 30 may comprise any organic or inorganic dielectric material recognized by a person having ordinary skill in the art, which may be deposited by any number of well known conventional techniques such as sputtering, spin-on application, chemical vapor deposition (CVD) process or a plasma enhanced CVD (PECVD) process. Candidate inorganic dielectric materials for insulating layers 18, 24, 30 may include, but are not limited to, silicon dioxide, fluorine-doped silicon glass (FSG), and combinations of these dielectric materials. The dielectric material constituting insulating layers 18, 24, 30 may be characterized by a relative permittivity or dielectric constant smaller than the dielectric constant of silicon dioxide, which is about 3.9. Candidate low-k dielectric materials for insulating layers 18, 24, 30 include, but are not limited to, porous and nonporous spin-on organic low-k dielectrics, such as spin-on aromatic thermoset polymer resins, porous and nonporous inorganic low-k dielectrics, such as organosilicate glasses, hydrogen-enriched silicon oxycarbide (SiCOH), and carbon-doped oxides, and combinations of organic and inorganic dielectrics. Fabricating the insulating layers 18, 24, 30 from such low-k materials may operate to lower the capacitance of the completed interconnect structure as understood by a person having ordinary skill in the art.

Suitable conductive materials for the signal conductor 12, ground conductors 14, 16, shield conductors 22, and shield conductors 28 include, but are not limited to, copper (Cu), aluminum (Al), alloys of these metals, and other similar metals. These metals may be deposited by conventional deposition processes including, but not limited to a CVD process and an electrochemical process like electroplating or electroless plating. A thin liner (not shown) may clad one or more sides of the signal conductor 12, the ground conductors 14, 16, the shield conductors 22, and the shield conductors 28. The liner may comprise, for example, a bilayer of titanium and titanium nitride or a bilayer of tantalum or tantalum nitride applied by conventional deposition processes. The vias 36, 38, 40, 42, 44, 46, 48, 50 may be composed of a material such as tungsten (W) or other materials recognized by a person having ordinary skill in the art.

The ground conductors 14, 16 remain unperturbed by the addition of the arrays 20, 26 so there is little effect on signal propagation on the signal conductor 12. The coplanar waveguide structure 10 may be matched with different impedance over a wide range of frequencies up to 120 GHz by using different metal layer options during BEOL processing. The coplanar waveguide structure 10 presents a low-cost on-chip slow wave solution and is fabricated using standard CMOS fabrication processes.

The coplanar waveguide structure 10 may be fabricated using BEOL design structures that have already passed the design rule check (DRC) and the layout versus schematic (LVS) check relating to metal fill requirements. The LVS check verifies whether a particular integrated circuit layout corresponds to the original schematic or circuit diagram of the design. DRC determines whether a particular chip layout satisfies a series of design rules, such as a width rule, a spacing rule, an enclosure rule, etc. In particular, the geometries of the shield conductors 22, 28 are optimized to simultaneously satisfy wave propagation and metal fill requirements required for successful polishing in a copper metallurgy process.

Figure 2:
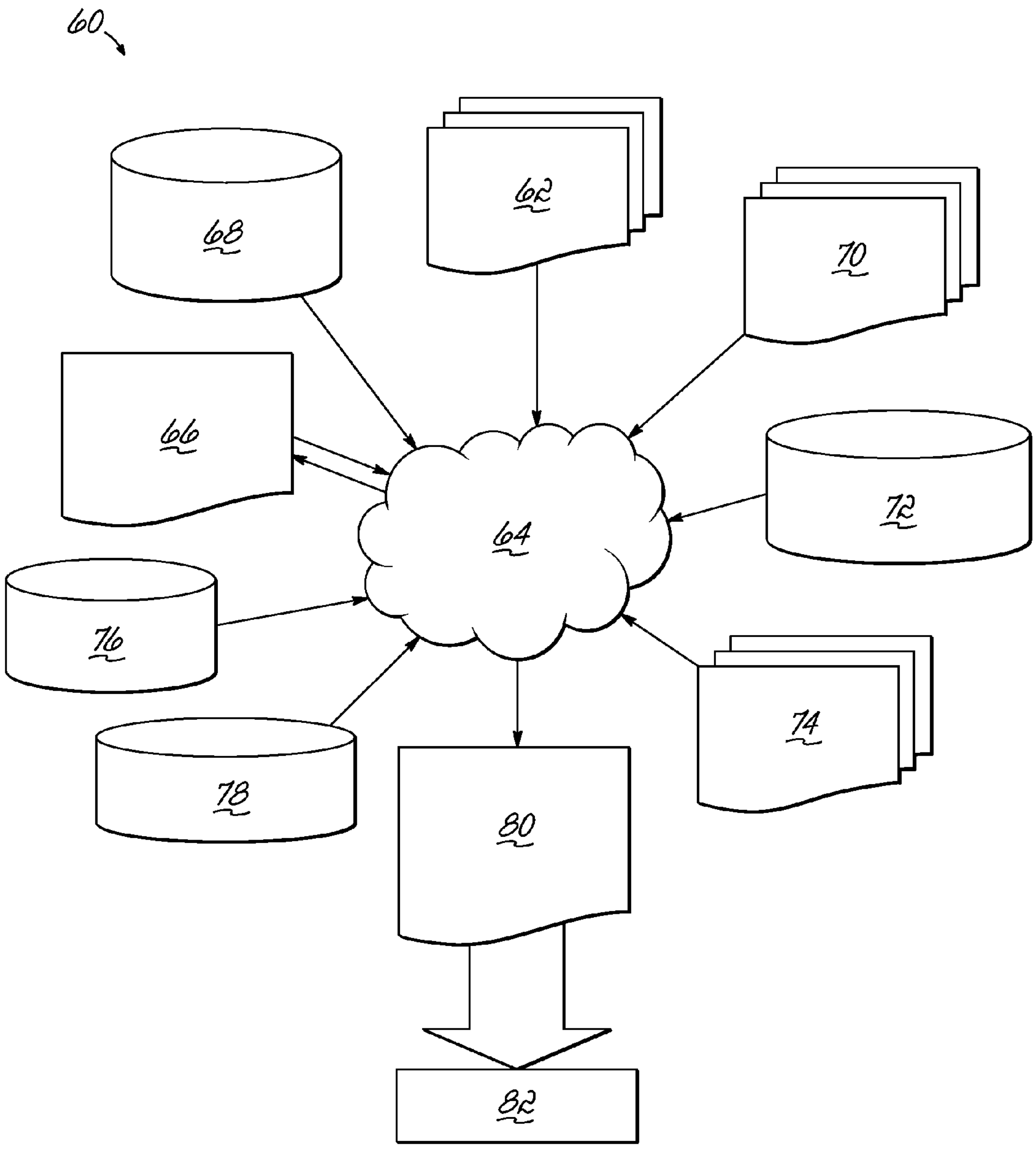
FIG. 2 is a flow diagram of a design process used in semiconductor design, manufacture, and/or test.

FIG. 2 shows a block diagram of an exemplary design flow 60 used for example, in semiconductor design, manufacturing, and/or test. Design flow 60 may vary depending on the type of IC being designed. For example, a design flow 60 for building an application specific IC (ASIC) may differ from a design flow 60 for designing a standard component or from a design flow 60 for instantiating the design into a programmable array, for example a programmable gate array (PGA) or a field programmable gate array (FPGA) offered by Altera® Inc. or Xilinx® Inc. Design structure 62 is preferably an input to a design process 64 and may come from an IP provider, a core developer, or other design company or may be generated by the operator of the design flow, or from other sources. Design structure 62 comprises an embodiment of the invention as shown in FIGS. 1, 1A, 1B in the form of schematics or HDL, a hardware-description language (e.g., Verilog, VHDL, C, etc.). Design structure 62 may be contained on one or more machine readable medium. For example, design structure 62 may be a text file or a graphical representation of an embodiment of the invention as shown in FIGS. 1, 1A, 1B. Design process 64 preferably synthesizes (or translates) an embodiment of the invention as shown in FIGS. 1, 1A, 1B into a netlist 66, where netlist 66 is, for example, a list of wires, transistors, logic gates, control circuits, I/O, models, etc. that describes the connections to other elements and circuits in an integrated circuit design and recorded on at least one of machine readable medium. For example, the medium may be a CD, a compact flash, other flash memory, a packet of data to be sent via the Internet, or other networking suitable means. The synthesis may be an iterative process in which netlist 66 is resynthesized one or more times depending on design specifications and parameters for the circuit.

Design process 64 may include using a variety of inputs; for example, inputs from library elements 68 which may house a set of commonly used elements, circuits, and devices, including models, layouts, and symbolic representations, for a given manufacturing technology (e.g., different technology nodes, 32 nm, 45 nm, 90 nm, etc.), design specifications 70, characterization data 72, verification data 74, design rules 76, and test data files 78 (which may include test patterns and other testing information). Design process 64 may further include, for example, standard circuit design processes such as timing analysis, verification, design rule checking, place and route operations, etc. One of ordinary skill in the art of integrated circuit design can appreciate the extent of possible electronic design automation tools and applications used in design process 64 without deviating from the scope and spirit of the invention. The design structure of the invention is not limited to any specific design flow.

Design process 64 preferably translates an embodiment of the invention as shown in FIGS. 1, 1A, 1B, along with any additional integrated circuit design or data (if applicable), into a second design structure 80. Design structure 80 resides on a storage medium in a data format used for the exchange of layout data of integrated circuits and/or symbolic data format (e.g. information stored in a GDSII (GDS2), GL1, OASIS, map files, or any other suitable format for storing such design structures). Design structure 80 may comprise information such as, for example, symbolic data, map files, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 1, 1A, 1B. Design structure 80 may then proceed to a stage 82 where, for example, design structure 80 proceeds to tape-out, is released to manufacturing, is released to a mask house, is sent to another design house, is sent back to the customer, etc.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The term "vertical" refers to a direction perpendicular to the horizontal, as just defined. Terms, such as "on", "above", "below", "side" (as in "sidewall"), "upper", "lower", "over", "beneath", and "under", are defined with respect to the horizontal plane. It is understood that various other frames of reference may be employed for describing the invention without departing from the spirit and scope of the invention. It is also understood that features of the invention are not necessarily shown to scale in the drawings. Furthermore, to the extent that the terms "includes", "having", "has", "with", or variants thereof are used in either the detailed description or the claims, such terms are intended to be inclusive in a manner similar to the term "comprising."

It will be understood that when an element as a layer, region or substrate is described as being "on" or "over" another element, it can be directly on or over the other element or intervening elements may also be present. In contrast, when an element is described as being "directly on" or "directly over" another element, there are no intervening elements present. It will also be understood that when an element is described as being "connected" or "coupled" to another element, it can be directly connected or coupled to the other element or intervening elements may be present. In contrast, when an element is described as being "directly connected" or "directly coupled" to another element, there are no intervening elements present.

The fabrication of the semiconductor structure herein has been described by a specific order of fabrication stages and steps. However, it is understood that the order may differ from that described. For example, the order of two or more fabrication steps may be swapped relative to the order shown. Moreover, two or more fabrication steps may be conducted either concurrently or with partial concurrence. In addition, various fabrication steps may be omitted and other fabrication steps may be added. It is understood that all such variations are within the scope of the present invention. It is also understood that features of the present invention are not necessarily shown to scale in the drawings.

While the invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. Thus, the invention in its broader aspects is therefore not limited to the specific details, representative apparatus and method, and illustrative example shown and described. Accordingly, departures may be made from such details without departing from the spirit or scope of applicants' general inventive concept.

What is claimed is:

1. A method of fabricating a coplanar waveguide structure, the method comprising:

forming first and second ground conductors and a signal conductor in a coplanar arrangement with the signal conductor arranged laterally between the first and second ground conductors;

forming a first coplanar array of substantially parallel shield conductors above the signal conductor and the first and second ground conductors;

forming a second coplanar array of substantially parallel shield conductors below the signal conductor and the first and second ground conductors;

forming a first plurality of conductive bridges located laterally between the signal conductor and the first ground conductor, each of the first plurality of conductive bridges connecting one of the shield conductors in the first array with one of the shield conductors in the second array; and forming a second plurality of conductive bridges located laterally between the signal conductor and the second ground conductor, each of the second plurality of conductive bridges connecting one of the shield conductors in the first array with one of the shield conductors in the second array.

2. The method of claim 1 wherein forming the signal conductor and the first and second ground conductors further comprises:

forming metal features in a first metal layer of a BEOL interconnect structure that define the signal conductor and the first and second ground conductors.

3. The method of claim 2 wherein forming the first array of substantially parallel shield conductors further comprises:

forming metal features in a second metal layer of the BEOL interconnect structure above the first metal layer that define the first array of shield conductors.

4. The method of claim 3 wherein forming the second array of substantially parallel shield conductors further comprises:

forming metal features in a third metal layer of the BEOL interconnect structure below the first metal layer that define the second array of shield conductors.

5. The method of claim 4 wherein the first plurality of shield conductors and the second plurality of shield conductors have geometries optimized to simultaneously satisfy wave propagation requirements for the signal conductor and metal fill requirements for the BEOL interconnect structure.

6. The method of claim 2 wherein forming the second array of substantially parallel shield conductors further comprises:

forming metal features in a second metal layer of the BEOL interconnect structure below the first metal layer that define the second array of shield conductors.

7. The method of claim 1 further comprising:

forming a discontinuous row of first planar segments between the signal conductor and the first ground conductor, each of the first planar segments in the row contacted by one of the first plurality of conductive bridges.

8. The method of claim 7 further comprising:

forming a discontinuous row of second planar segments between the signal conductor and the second ground conductor, each of the second planar segments in the row contacted by one of the second plurality of conductive bridges.

9. The method of claim 1 wherein the first plurality of conductive bridges are spaced closer to the signal conductor than to the first ground conductor, and the second plurality of conductive bridges are spaced closer to the signal conductor than to the second ground conductor.

10. A method of fabricating a coplanar waveguide structure, the method comprising:

forming metal features in a first metal layer of a BEOL interconnect structure that define a signal conductor and first and second ground conductors flanking the signal conductor;

forming metal features in a second metal layer of the BEOL interconnect structure above the first metal layer that define a first array of shield conductors;

forming metal features in a third metal layer of the BEOL interconnect structure below the first metal layer that define a second array of shield conductors; and connecting the metal features in the second and third arrays with conductive bridges to define a plurality of closed loops extending about the signal conductor, wherein the first plurality of shield conductors and the second plurality of shield conductors have geometries optimized to simultaneously satisfy wave propagation requirements for the signal conductor and metal fill requirements for the BEOL interconnect structure.

11. The method of claim 10 wherein the first, second, and third metal layers are formed by CMOS processes.

* * * * *